(12) United States Patent
Prejbeanu et al.

(10) Patent No.: US 9,324,936 B2
(45) Date of Patent: Apr. 26, 2016

(54) MAGNETIC LOGIC UNIT (MLU) CELL AND AMPLIFIER HAVING A LINEAR MAGNETIC SIGNAL

(71) Applicant: CROCUS Technology SA, Grenoble Cedex (FR)

(72) Inventors: Ioan Lucian Prejbeanu, Seyssinet Pariset (FR); Bernard Dieny, Lans-en-Vercors (FR); Kenneth MacKay, Le Sappey en Chartreuse (FR); Bertrand Cambou, Palo Alto, CA (US)

(73) Assignee: CROCUS TECHNOLOGY SA, Grenoble (FR)

( * ) Notice: Subject to any disclaimer, the term of this patent is extended or adjusted under 35 U.S.C. 154(b) by 0 days.

(21) Appl. No.: 14/431,140

(22) PCT Filed: Sep. 12, 2013

(86) PCT No.: PCT/EP2013/068866
§ 371 (c)(1),
(2) Date: Mar. 25, 2015

(87) PCT Pub. No.: WO2014/048757
PCT Pub. Date: Apr. 3, 2014

(65) Prior Publication Data
US 2015/0270479 A1    Sep. 24, 2015

(30) Foreign Application Priority Data

Sep. 25, 2012 (EP) .................................... 12290316

(51) Int. Cl.
| | | |
|---|---|---|
| *H01L 43/00* | (2006.01) |
| *H01L 29/82* | (2006.01) |
| *H01L 43/02* | (2006.01) |
| *H03F 15/00* | (2006.01) |
| *G11C 11/16* | (2006.01) |
| *H01L 43/10* | (2006.01) |
| *H03K 19/18* | (2006.01) |

(52) U.S. Cl.
CPC ............... *H01L 43/02* (2013.01); *G11C 11/16* (2013.01); *G11C 11/1675* (2013.01); *H01L 43/10* (2013.01); *H03F 15/00* (2013.01); *H03K 19/18* (2013.01)

(58) Field of Classification Search
CPC ............................. H01L 43/02; H01L 43/10
USPC ............................................ 257/422; 438/48
See application file for complete search history.

(56) References Cited

U.S. PATENT DOCUMENTS

| | | |
|---|---|---|
| 6,259,586 B1 | 7/2001 | Gill |
| 6,356,147 B1 | 3/2002 | Ghoshal |

(Continued)

FOREIGN PATENT DOCUMENTS

JP    2006253562 A1    8/2010

OTHER PUBLICATIONS

International Search Report for PCT/EP2013/068866 dated Oct. 7, 2013.

(Continued)

*Primary Examiner* — Theresa T Doan
(74) *Attorney, Agent, or Firm* — Pearne & Gordon LLP

(57) ABSTRACT

A magnetic logic unit (MLU) cell includes a first and second magnetic tunnel junction, each including a first magnetic layer having a first magnetization, a second magnetic layer having a second magnetization, and a barrier layer; and a field line for passing a field current such as to generate an external magnetic field adapted to adjust the first magnetization. The first and second magnetic layers and the barrier layer are arranged such that the first magnetization is magnetically coupled antiparallel with the second magnetization through the barrier layer. The MLU cell also includes a biasing device arranged for applying a static biasing magnetic field oriented substantially parallel to the external magnetic field such as to orient the first magnetization at about 90° relative to the second magnetization, the first and second magnetizations being oriented symmetrically relative to the direction of the external magnetic field.

10 Claims, 7 Drawing Sheets

(56) References Cited

U.S. PATENT DOCUMENTS

| | | | |
|---|---|---|---|
| 7,196,882 B2 * | 3/2007 | Deak | 360/324.2 |
| 7,477,490 B2 * | 1/2009 | Gao et al. | 360/324.1 |
| 2005/0216244 A1 | 9/2005 | Nahas | |
| 2010/0193890 A1 | 8/2010 | Suzuki et al. | |
| 2012/0088125 A1 | 4/2012 | Nishiyama et al. | |

OTHER PUBLICATIONS

Written Opinion for PCT/EP2013/068866 dated Oct. 7, 2013.

* cited by examiner

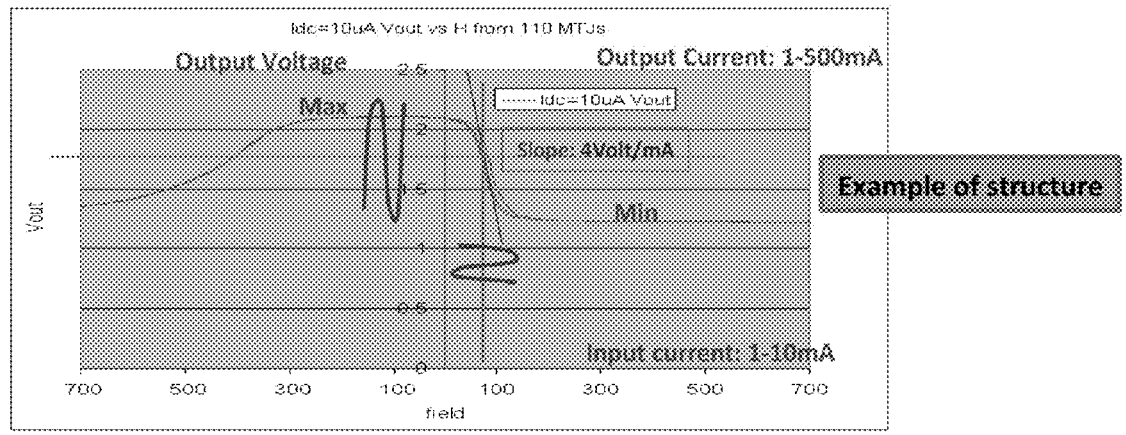
Fig. 1 (State of art)
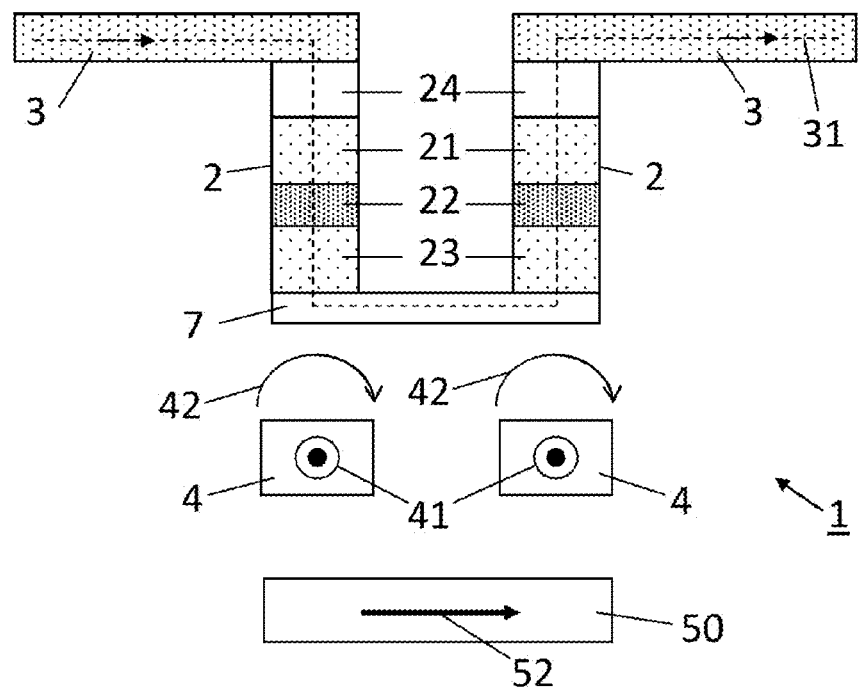
Fig. 2a

MAGNETIC LOGIC UNIT (MLU) CELL AND AMPLIFIER HAVING A LINEAR MAGNETIC SIGNAL

FIELD

The present invention concerns a magnetic logic unit (MLU) cell based on MRAM technology having a linear magnetic signal. The present invention further concerns a MLU amplifier comprising a plurality of the MLU cell.

DESCRIPTION OF RELATED ART

A conventional MRAM cell comprises a magnetic tunnel junction comprising a ferromagnetic reference layer and a ferromagnetic storage layer. When the magnetizations of the two layers are aligned the resistance of the stack is low, this could be a "0" (or arbitrarily a "1"). When the layers are anti-aligned the resistance is high, this could be a "1" (or vice versa).

In thermally-assisted-switching (TAS) MRAM's the storage layer is blocked by an antiferromagnetic layer such as to achieve superior stability in normal operating temperatures. During a programming cycle, the temperature of the cell is momentarily locally raised above a blocking temperature of the antiferromagnetic layer, through resistive heating of the magnetic tunnel junction, allowing the magnetoresistance of the TAS-MRAM cell to be varied. At normal operating temperatures the information stored in TAS-MRAM memory cells is thus not affected by external fields and noise.

Self-referenced MRAM cells can be based on TAS MRAM cells. Self-referenced MRAM cells typically have the reference layer that is not pinned by an antiferromagnetic layer but is free to be varied. Such unpinned reference layer is often called "sense layer". When a current is applied in a field line adjacent to the MRAM cell, a magnetic field is generated such as to vary the sense layer magnetization during a read operation. A two-phase read operation utilizes the natural tendency of an un-driven field line's effect on a selected memory cell to create a momentary reference value that is compared to the cell's value when the field is driven. The stored information is thus read as this field is applied.

It has been previously reported that self-reference structures based on magnetic random access memory (MRAM) cells can utilize programming field lines for controlling the terminal that modulates the resistivity of magnetic tunnel junctions in a way that is similar to modulating the resistivity of an MOS channel of a transistor gate. However, the gain of each three-terminal MRAM cell is extremely low; the feed forward coupling capacitance between input and output is remarkably tiny.

A magnetic logic unit (MLU) cell is built on the self-referenced TAS MRAM technology. During logic operations the field lines are acting as controlling gates modulating the resistivity of the magnetic tunnel junction. The MLU cell behaves as a three-terminal device capable of performing native logical functions. The currents circulating in the field line can be modulated in direction, and intensity.

Traditional active devices for power amplifiers are based out of bipolar, MOS, GaAS HBT, GaN transistors connected together to form a structure large enough to handle the power. Matching passive component circuits are used to extract the AC output power for high frequency applications. This suggested MLU amplifier is based on connecting together thousands of MTJs to get the desired power out.

A MLU amplifier can be provided by electrically coupling an array comprising several (possibly tens of thousands) of MLU cells together. The gain of the resulting amplifier is largely increased device while the coupling capacitance remains very small.

For each MLU cell, the magnetoresistance of the magnetic tunnel junction is modulated by the direction of a field current flowing through a field line which is set by an input bit to be matched. A high or low magnetoresistance at the output indicates whether the input bit matches the stored bit or not, respectively.

The total output power delivered by the array of MLU cells (MLU amplifier) is given by Equation 1:

$$P_{out} = N \times P_{mtj} \quad \text{(Equation 1)},$$

where N is the total number of magnetic tunnel junctions in the array, and $P_{mtj}$ the power delivered by a single magnetic tunnel junction. Considering that each MLU cell is very small, for example down to 100 nm, the total output power can be high in an array comprising a millions of magnetic tunnel junctions. Moreover, the MLU amplifier is an active device that can be built without any CMOS substrate. Consequently, a low cost five mask process on a bare substrate can be appropriate to manufacture such MLU amplifier. Only two extra masking processes on a standard CMOS process will enable System On a Chip capability that integrates MLU amplifier solutions.

FIG. 1 shows an output voltage and an output current generated by the MLU amplifier upon passing an input current in a current line electrically connecting in series the plurality of MLU cells. For Class A operation the input current need to be set at the cutoff level where the output impedance is in the middle of the potential excursion to deliver the highest gain. The AC signal at the input stage will create large resistance variations in the output stage, creating a large output signal.

For linear amplification, class A, this current needs to be adjusted to the particular point where slope of the IV curve is the highest. For maximum power efficiency, class C, the input set up will be where the DC power is at its minimum (all magnetic tunnel junctions having their storage and sense magnetization parallel).

The output of the MLU cell and of the MLU amplifier can be determined by a hysteresis loop reporting the applied magnetic field against the magnetization of the MLU cell(s). The presence of a large hysteresis curve will prevent the MLU amplifier to operate on a class C mode, and will require at least a full 1 mA input peak current swing to operate class C.

SUMMARY

The present disclosure concerns a magnetic logic unit (MLU) cell comprising: a first magnetic tunnel junction and a second magnetic tunnel junction, each magnetic tunnel junction comprising a first ferromagnetic layer having a first magnetization, a second ferromagnetic layer having a second magnetization, and a barrier layer between the first and second ferromagnetic layers; a strap, electrically connecting the magnetic tunnel junction in series with the second magnetic tunnel junction; and a field line for passing a field current such as to generate an external magnetic field adapted to adjust the first magnetization; the first and second ferromagnetic layers and the barrier layer being arranged such that the first magnetization is magnetically coupled antiparallel with the second magnetization through the barrier layer; the MLU cell further comprising a biasing device arranged for applying a static biasing magnetic field oriented substantially parallel to the external magnetic field such as to orient the first magnetization at about 90° relative to the second magnetization, the first and second magnetizations being oriented symmetrically relative to the direction of the external magnetic field. The magnetic tunnel junction magnetization varies linearly with the generated external magnetic field.

The present disclosure also concerns an MLU amplifier comprising a plurality of the MLU cell.

The disclosed MLU amplifier has large gains and extended cut off frequencies. The MLU amplifier maximizes the linearity and/or the TMR.

BRIEF DESCRIPTION OF THE DRAWINGS

The invention will be better understood with the aid of the description of an embodiment given by way of example and illustrated by the figures, in which:

FIG. 1 represents an output voltage and an output current generated by a MLU amplifier;

FIG. 2a shows a cross section view of a magnetic logic unit (MLU) cell comprising two magnetic tunnel junctions, each magnetic tunnel junction comprising a first magnetic layer separated from a second magnetic layer by a barrier layer;

DETAILED DESCRIPTION OF POSSIBLE EMBODIMENTS

Figure 2B:
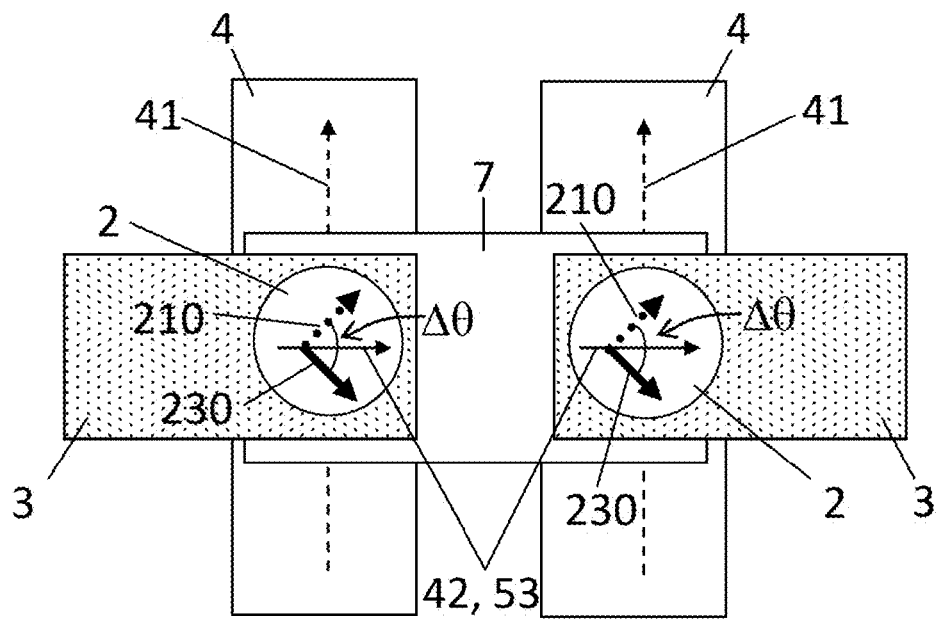
FIG. 2b shows a top view of a magnetic logic unit (MLU) cell comprising two magnetic tunnel junctions, each magnetic tunnel junction comprising a first magnetic layer separated from a second magnetic layer by a barrier layer.

FIG. 2 shows a cross section view (a) and a top view (b) of an MLU cell 1 according to an embodiment. The MLU cell 1 comprises a first and second magnetic tunnel junction 2, each of the two magnetic tunnel junctions 2 being electrically connected in series at one end via an electrically conductive strap 7. A current line 3 is electrically connected to the other end of the magnetic tunnel junctions 2. The current line 3 can be used to pass a heating current during a write operation or a read current during a read operation. The MLU cell 1 further comprises a field line 4 arranged for passing a field current 41 such as to generate an external magnetic field 42. In the example of FIG. 2, the field line 4 is represented as two parallel field line portions 4' located at the end of the magnetic tunnel junctions 2 connecting the strap 7. The field line 4 (or each of the field line portions 4') can preferably comprise a cladding.

Figure 3:
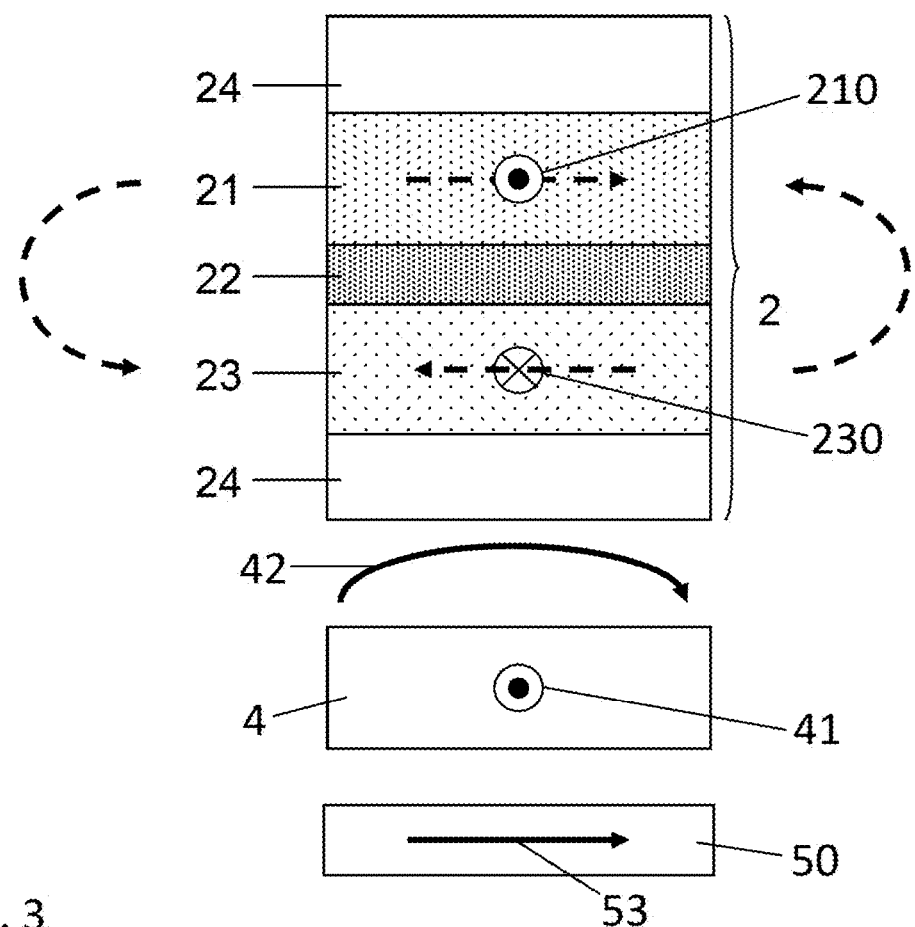
FIG. 3 illustrates one of the magnetic tunnel junctions of the MLU cell, according to an embodiment.

FIG. 3 illustrates one of the magnetic tunnel junctions 2 of the MLU cell 1, according to an embodiment. The magnetic tunnel junction 2 includes a first magnetic layer 21 having a first magnetization 210 and a second magnetic layer 23 having a second magnetization 230, and a barrier layer 22 between the first and second magnetic layer 21, 23. The magnetic tunnel junction 2 is arranged such as to behave as a pseudo spin valve, wherein the first magnetization 210 is magnetically coupled antiparallel with the second magnetization 230 through the barrier layer 22. The magnetic tunnel junction 2 further comprises a non-magnetic layer 24 in contact with the side of the first magnetic layer 21 opposed to the one contacting the barrier layer 22, and another non-magnetic layer 24 in contact with the side of the second magnetic layer 23 opposed to the one contacting the barrier layer 22. The non-magnetic layer 24 can comprise tantalum.

The first layer 21 is arranged such that the magnetic tunnel junction magnetization varies linearly with the generated external magnetic field 42.

The barrier layer 22 is non-magnetic and preferably comprises an MgO oxide. Preferably, the barrier layer 22 has a thickness typically comprised between about 1 nm and 10 nm.

The magnetic tunnel junction can further comprise a thin MgO layer at the interface, or in the vicinity of the interface, between the non-magnetic layer 24 and the first and/or second magnetic layer 21, 23. The thin MgO layer allows increasing thermal stability of the magnetic tunnel junction 2 upon high temperature annealing. For example, the magnetic tunnel junction 2 comprising the thin MgO layer can withstand an annealing at a temperature larger than 400° C. and provide very large tunnel magnetoresistance (TMR) ranging between about 400% and 500%.

The first and second magnetic layer 21, 23 preferably comprise a CoFeB alloy. The two magnetic layers 21, 23 should be thick enough such as to increase the magnetic susceptibility of the magnetic tunnel junction 2 and lower the field are required to generate the TMR signal. The thickness should however not be too thick in order to avoid getting a vortex micromagnetic configuration in the magnetic layers 21, 23. For example, the magnetic layers 21, 23 can have a thickness typically comprised between about 1.5 nm and about 4 nm.

In an alternative embodiment, each of the two magnetic layers 21, 23 can be formed from a multilayer comprising a sequence of two magnetic layers separated by an intermediate layer comprising an element from at least one of a Group IIIB and Group IVB of the periodic table. For example, the multilayers can comprise a sequence such as CoFe/Ta/CoFeB as bottom electrode (on the side of the field line 4), wherein one of the CoFeB layer is in contact with the barrier layer 22. Here, the Ta layer plays the role of a boron getter layer. The Ta intermediate layer can be replaced by an intermediate layer comprising Ti, Hf, Zr or Nb. In any case, the intermediate layer should be thin enough to insure good magnetic coupling between CoFe and CoFeB. Alternatively, the intermediate layer can comprise a sequence of layers such as Ta/Ru/Ta.

Preferably, the first and second magnetic layer 21, 23 comprise materials having high Curie temperature, i.e., large stiffness constant such as to hinder formation of the vortex micromagnetic configuration. The conditions for having a quasi macrospin behavior in a cylindrical magnetic layer of thickness L and radius R are known. For the purpose of this disclosure, the configuration of the magnetization 210, 230 should be in a leaf state.

Magnetostatic coupling energy $E_{MS}$ between the two magnetic layers 21, 23 in the configuration of FIG. 3 can be expressed in macrospin approximation with Equation 2:

$$E_{MS} = \frac{\mu_0}{4\pi} \frac{\vec{M_1} \cdot \vec{M_2}}{d^3} = A\vec{M_1} \cdot \vec{M_2}, \quad \text{(Equation 2)}$$

where $M_1$ and $M_2$ are the magnetic moment of the two magnetic layers 21, 23 being proportional to their magnetization 210, 230 and the volume of each of the layers 21, 23, $\mu_o$ is the magnetic constant, A is a characteristics surface area, d is the distance between the two moments $M_1$ and $M_2$. In macrospin approximation, the distance d between the two moments $M_1$ and $M_2$ is given by Equation 3:

$$d = t_{MgO} + \tfrac{1}{2}t_{F1} + \tfrac{1}{2}t_{F2} \qquad \text{(Equation 3)},$$

where $t_{MgO}$ is the thickness of the barrier layer 22, $t_{F1}$ is the thickness of first magnetic layer 21 and $t_{F2}$ is the thickness of second magnetic layer 23. The magnetostatic energy has the same functional form as an antiferromagnetic coupling through the MgO barrier layer 22.

Neglecting any anisotropy term, the total energy E in presence of a magnetic field H (such as the external magnetic field 42) can be written by Equation 4:

$$E = -\mu_0 \vec{M}_1 \cdot \vec{H} - \mu_0 \vec{M}_2 \cdot \vec{H} + A \vec{M}_1 \cdot \vec{M}_2 \qquad \text{(Equation 4)}.$$

Figure 4:
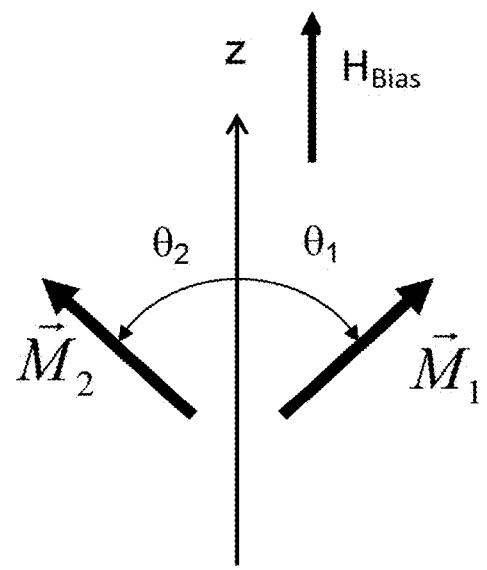
FIG. 4 shows the orientation of magnetic moment of the two magnetic layers in the presence of a magnetic field.

Assuming that the two magnetic layers 21, 23 have the same magnetic moment $M_1$, $M_2$, the energy E can be easily minimized, yielding:

$$\cos\theta_1 = \cos\theta_2 = \frac{\mu_0 M_1 H}{2A}, \qquad \text{(Equation 5)}$$

where $\theta_1$ and $\theta_2$ is the angle between the direction of the magnetic field and the first and second magnetization 210, 230, respectively (see FIG. 4). As a result, the magnetization response M(H) as a function of the magnetic field can be expressed by Equation 6 (see FIG. 5):

$$\frac{M(H)}{M_{sat}} = 2M_1 \cos\theta_1 = \frac{\mu_0 M_1 H}{2A}, \qquad \text{(Equation 6)}$$

where $M_{sat}$ is the saturation magnetization.

The response M(H) is thus linear for the applied magnetic field H. The tunnel magnetoresistance response R(H) as a function of the magnetic field can be obtained by Equation 7:

$$R(H) = R_P + \frac{\Delta R}{2}(1 - \cos\Delta\theta), \qquad \text{(Equation 7)}$$

where $R_{min}$ is the tunnel magnetic junction resistance when the first and second magnetizations are parallel, $\Delta R$ is and where $\Delta\theta = \theta_1 - \theta_2$.

Equation 7 is equivalent to:

$$R(H) = R_{AP} - \Delta R \cos^2\theta_1 = R_{AP} - \frac{\Delta R}{2}\left(\frac{\mu_0 M_1 H}{2A}\right)^2, \qquad \text{(Equation 8)}$$

where $R_{max}$ is the tunnel magnetic junction resistance when the first and second magnetizations are antiparallel.

The tunnel magnetoresistance response R(H) is quadratic in the applied field H. It is thus necessary to bias it around $\theta_1 = -\theta_2 = 45°$ to locally linearize the characteristic.

Figure 5:
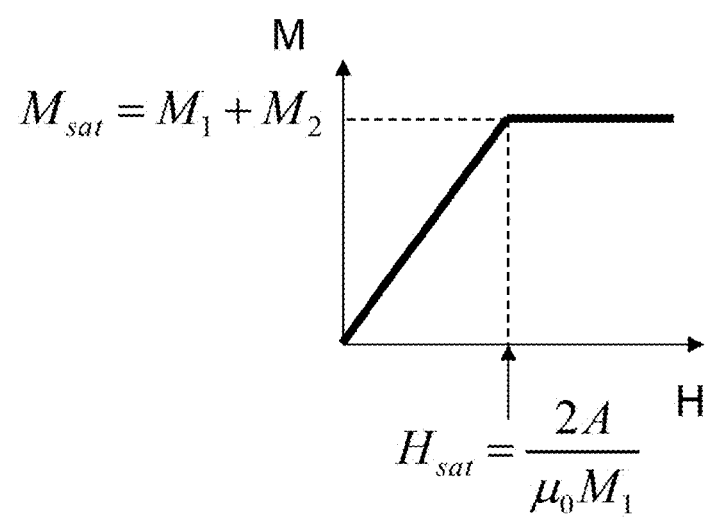
FIG. 5 shows the magnetization response of the tunnel magnetic junction as a function of the magnetic field.
Figure 6:
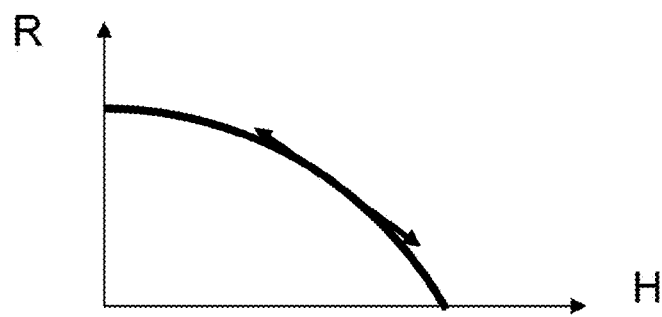
FIG. 6 illustrates the tunnel magnetoresistance response as a function of the magnetic field.

This biasing can be achieved by applying a static biasing magnetic field $H_{bias}$ on the magnetic tunnel junction 2 being of the order of:

$$H_{bias} = \frac{H_{sat}}{\sqrt{2}}, \qquad \text{(Equation 9)}$$

where $H_{sat}$ is the saturation magnetic field. In other words, the biasing magnetic field $H_{bias}$ is such as to orient the first magnetoresistance 210 substantially at $\Delta\theta=90°$ with respect to the second magnetoresistance 230. FIG. 5 illustrates the first magnetoresistance 210 (indicated by symbol $\vec{M}_1$) and the second magnetoresistance 230 (indicated by symbol $\vec{M}_2$) being oriented with an angle $\theta_1$ and $\theta_2$, respectively, with respect to the biasing magnetic field $H_{bias}$.

Figure 7:
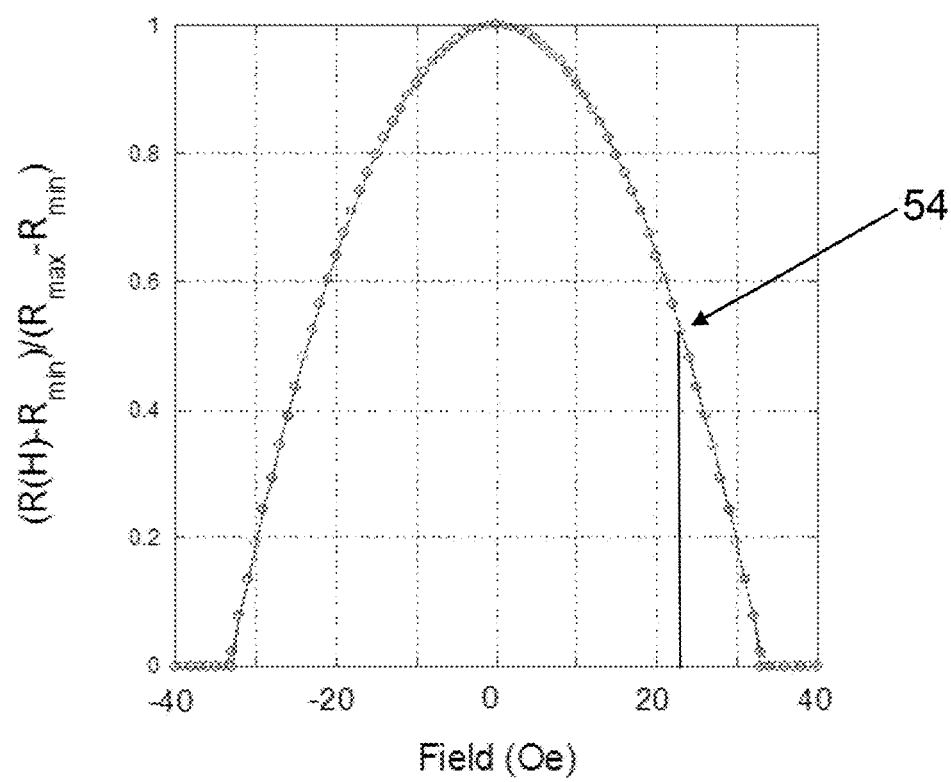
FIG. 7 shows the tunnel magnetoresistance response for the two magnetic layers coupled through the barrier layer.

FIG. 7 shows an example of the tunnel magnetoresistance response R(H) for an first magnetization magnetically coupled antiparallel with a second magnetization through a barrier layer, such as in the magnetic tunnel junction 2 of FIG. 3. The point indicated by numeral 54 corresponds to the bias point, i.e., the magnetoresistance response in the presence of the biasing magnetic field $H_{bias}$. Again, in FIG. 7, $R_{min}$ corresponds to the magnetoresistance of the magnetic tunnel junction 2 when the first and second magnetizations 210, 230 are parallel and $R_{max}$ corresponds to the magnetoresistance when the first and second magnetizations 210, 230 are antiparallel.

The MLU cell 1 further comprises a biasing device 50 arranged for applying a static biasing magnetic field 53 (corresponding to the biasing magnetic field $H_{bias}$) that is oriented substantially parallel to the external magnetic field 42 generated by the field line 4 and substantially perpendicular to the field line 4. The static biasing magnetic field 53 applied by the bias device 50 is such as to orient the first magnetization 210 at about 90° relative to the second magnetization 230, the first and second magnetizations being oriented symmetrically relative to the direction of the external magnetic field 42. In other words, the first magnetization 210 is oriented with an angle of about 45° relative to the direction of the external magnetic field 42 and the second magnetization 230 is oriented with an angle of about −45° relative to the direction of the external magnetic field 42 (see FIG. 2b).

Applying the external magnetic field 42 by passing the field current 41 in the field line 4 moves further the first magnetization 210 relative to the second magnetization 230 towards an angle $\Delta\theta$ of 0°, where the first and second magnetizations 210, 230 are substantially parallel, or an angle $\Delta\theta$ of 180° where the first and second magnetizations 210, 230 are substantially antiparallel, depending on the direction of the external magnetic field 42. In particular, in the case the external magnetic field 42 is oriented in the same direction as the biasing magnetic field 53 (as shown in FIG. 2b), the first magnetizations 210 is oriented with an angle of angle $\Delta\theta$ of about 0° relative to the second magnetization 230, whereas in the case the external magnetic field 42 is oriented in a direction opposed to the one of the biasing magnetic field 53, the first magnetization 210 is oriented with an angle of angle $\Delta\theta$ of about 180° relative to the second magnetization 230. The moving of the second magnetization 230 relative to the first magnetization 210 is caused by the magnetic coupling between the first and second magnetization 210, 230 through the barrier layer 22.

In the embodiment of FIG. 3, the biasing device comprises a permanent magnet 50 arranged for applying the static biasing magnetic field 53. The magnet 50 can be located at one end of the magnetic tunnel junction 2 on the side of the field line 4, as shown in the example of FIG. 3, or at the other end of the magnetic tunnel junction 2. An advantage of this configuration is that the magnetic tunnel junction 2 can be annealed up to 520° C. yielding a TMR of up to 600%.

In another embodiment shown in FIG. 8, the biasing device comprises a biasing layer 51 included in the magnetic tunnel junction 2. The biasing layer 51 is arranged for generating the biasing magnetic field 53 being oriented substantially parallel to the external magnetic field 42 such as to orient the first magnetization 210 at about 90° relative to the second magnetization 230, the first and second magnetizations being oriented symmetrically relative to the direction of the external magnetic field 42.

Applying the external magnetic field 42 by passing the field current 41 in the field line 4 moves further the first magnetization 210 relative to the second magnetization 230 towards an angle Δθ of 0°, where the first and second magnetizations 210, 230 are substantially parallel, or an angle Δθ of 180° where the first and second magnetizations 210, 230 are substantially antiparallel, depending on the direction of the external magnetic field 42.

Figure 8A:
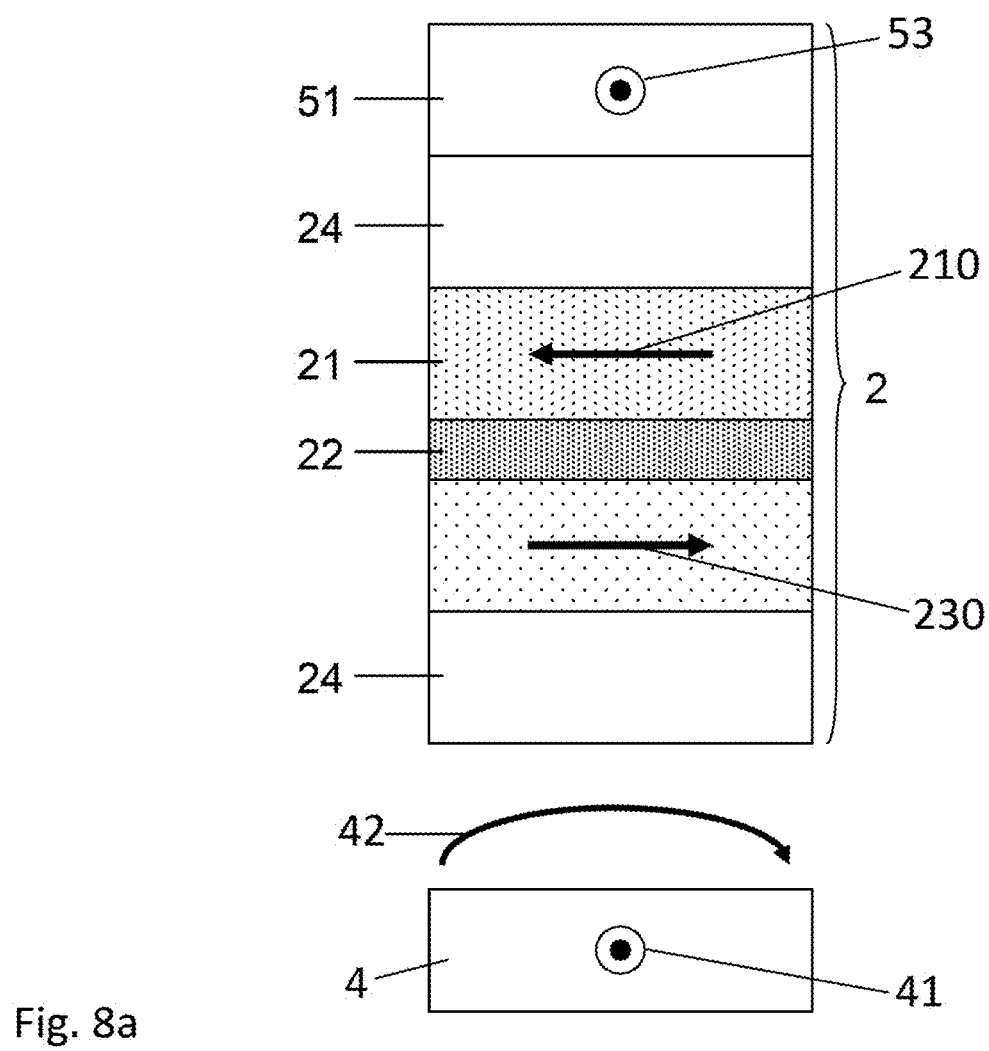
FIGS. 8a and b illustrates one of the magnetic tunnel junctions of the MLU cell, according to two other embodiments.

In a variant illustrated in FIG. 8a, the biasing layer 51 comprises a permanent magnet. In this configuration, the biasing layer 51 can comprise a FePt or a CoCr alloy.

Figure 8B:
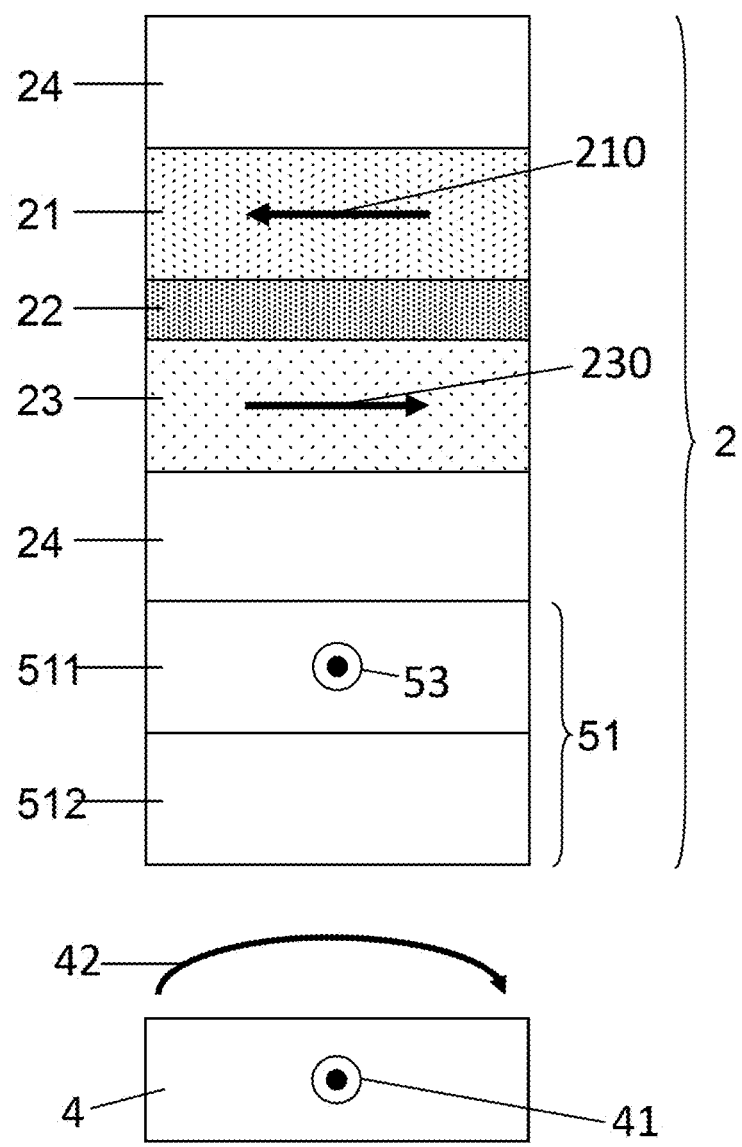

In a variant illustrated in FIG. 8b, the biasing layer 51 comprises an exchange biased pinned layer comprising a third magnetic layer 511 and an antiferromagnetic layer 512. The antiferromagnetic layer 512 exchange-couples the third magnetic layer 511 such that a magnetization of the magnetic layer 511, or biasing magnetic field 53, is oriented substantially parallel to the external magnetic field 42 such as to orient the first magnetization 210 at about 90° relative to the second magnetization 230, the first and second magnetizations being oriented symmetrically relative to the direction of the external magnetic field 42. The magnetic layer 511 can comprise a magnetic material such as CoFe and the antiferromagnetic layer 512 can comprise an antiferromagnetic material such as a PtMn alloy.

In a variant of the embodiment, the biasing layer 51 can be formed from a plurality of a multilayer comprising the magnetic layer 511 and antiferromagnetic layer 512. The number of multilayers can be such as to obtain a predetermined magnitude of the biasing magnetic field 53, for example being adequate for orienting the first magnetization 210 at about 90° relative to the second magnetization 230, the first and second magnetizations being oriented symmetrically relative to the direction of the external magnetic field 42.

In the configurations of FIGS. 8a and 8b, the biasing layer 51 is separated from the two magnetic layers 21, 23 with the non-magnetic layer 24. The biasing layer 51 can be on the side of the first magnetic layer 21 (FIG. 8a) or of the second magnetic layer 23 (FIG. 8b).

Figure 9:
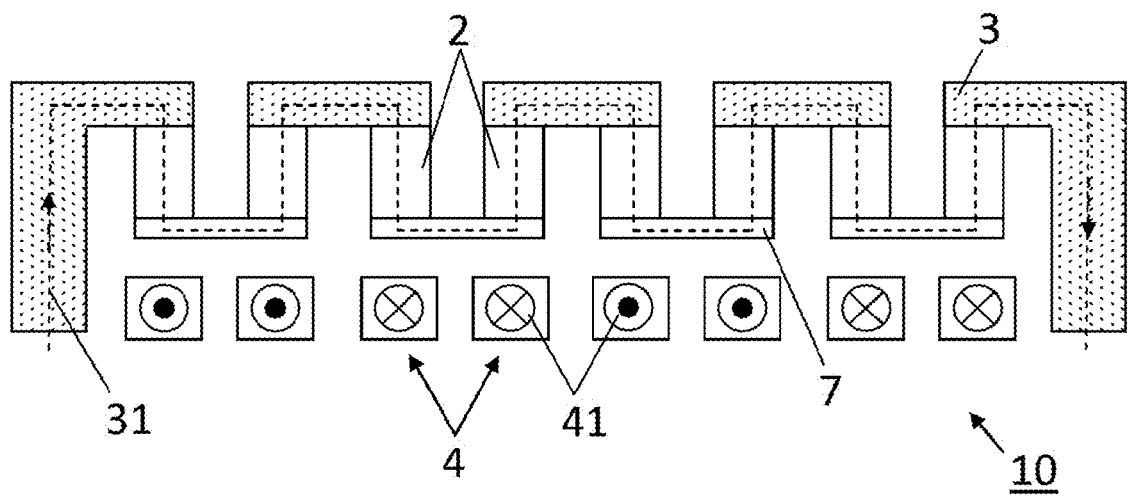
FIG. 9 shows a MLU amplifier comprising a plurality of MLU cells electrically connected in series.

FIG. 9 shows an MLU amplifier comprising a plurality of MLU cells 1 disclosed herein, the MLU cells 1 being electrically connected in series via the current line 3. In particular, the magnetic tunnel junctions of the plurality of MLU cells are all connected in series with each other via the current line 3 and the strap 7. Such configuration allows for increasing the output signal and the current gain.

The plurality of MLU cells is electrically connected in series in a way such as to avoid contact to the substrate. The field lines 4 of each MLU cell are electrically connected in series such as to form a continuous field line 4 in the array. In such an arrangement, the field line 4 can take the shape of a serpentine.

REFERENCE NUMBERS

1 MLU cell
10 MLU amplifier
2 first magnetic tunnel junction
2' second magnetic tunnel junction
21 first magnetic layer
210 first magnetization
22 barrier layer
23 second magnetic layer
230 second magnetization
24 non-magnetic layer
3 current line
4 field line
41 field current
42 magnetic field
50 biasing device, permanent magnet
51 biasing layer
511 third magnetic layer
512 antiferromagnetic layer
53 biasing magnetic field
54 bias point
7 strap
A Characteristics surface area
d distance d between the two moments $M_1$ and $M_2$
E total energy
$E_{MS}$ magnetostatic coupling energy
H magnetic field
$H_{bias}$ biasing magnetic field
$H_{SAT}$ saturation magnetic field
M(H) magnetization response
$M_1$ magnetic moment of first magnetic layer
$M_2$ magnetic moment of second magnetic layer
$M_{SAT}$ saturation magnetization
$P_{out}$ output power
$P_{mtj}$ power delivered by a magnetic tunnel junction
N number of magnetic tunnel junctions
$R_{min}$ minimum magnetoresistance
$R_{max}$ maximum magnetoresistance
$t_{MgO}$ barrier layer thickness
$t_{F1}$ thickness of first magnetic layer
$t_{F2}$ thickness of second magnetic layer
$\theta_1$ angle between magnetic field and first magnetization
$\theta_2$ angle between magnetic field and second magnetization
$\mu_o$ magnetic constant

The invention claimed is:

1. Magnetic logic unit (MLU) cell comprising:
   a first magnetic tunnel junction and a second magnetic tunnel junction, each magnetic tunnel junction comprising a first magnetic layer having a first magnetization, a second magnetic layer having a second magnetization, and a barrier layer between the first and second magnetic layers;
   a strap, electrically connecting the magnetic tunnel junction in series with the second magnetic tunnel junction; and
   a field line for passing a field current such as to generate an external magnetic field adapted to adjust the first magnetization;
   the first and second magnetic layers and the barrier layer being arranged such that the first magnetization is magnetically coupled antiparallel with the second magnetization through the barrier layer;
   the MLU cell further comprising a biasing device arranged for applying a static biasing magnetic field oriented substantially parallel to the external magnetic field such as to orient the first magnetization at about 90° relative to the second magnetization, the first and second magnetizations being oriented symmetrically relative to the direction of the external magnetic field.

2. The MLU cell according to claim 1, wherein
the biasing device comprises a permanent magnet arranged for applying the static biasing magnetic field.

3. The MLU cell according to claim 1, wherein
the biasing device comprises a biasing layer included in the magnetic tunnel junction and arranged for applying the static biasing magnetic field.

4. The MLU cell according to claim 3, wherein
the biasing layer comprises a permanent magnet.

5. The MLU cell according to claim 4, wherein
the biasing layer comprises a FePt or a CoCr alloy.

6. The MLU cell according to claim 3, wherein
the biasing layer comprises an exchange biased pinned layer comprising a third magnetic layer and an antiferromagnetic layer, and wherein
the antiferromagnetic layer exchange-couples the third magnetic layer such that a magnetization of the magnetic layer is oriented substantially parallel to the direction of the external magnetic field.

7. The MLU cell according to claim 6, wherein
the magnetic layer comprises a CoFe-based alloy.

8. The MLU cell according to claim 6, wherein
the antiferromagnetic layer comprises a PtMn-based alloy.

9. The MLU cell according to claim 6, wherein
the biasing layer comprises a plurality of multilayer comprising the magnetic layer and antiferromagnetic layer.

10. MLU amplifier comprising a plurality of MLU cells, each MLU cell comprising: a first magnetic tunnel junction and a second magnetic tunnel junction, each magnetic tunnel junction comprising a first magnetic layer having a first magnetization, a second magnetic layer having a second magnetization, and a barrier layer between the first and second magnetic layers; a strap, electrically connecting the magnetic tunnel junction in series with the second magnetic tunnel junction; and a field line for passing a field current such as to generate an external magnetic field adapted to adjust the first magnetization; the first and second magnetic layers and the barrier layer being arranged such that the first magnetization is magnetically coupled antiparallel with the second magnetization through the barrier layer; the MLU cell further comprising a biasing device arranged for applying a static biasing magnetic field oriented substantially parallel to the external magnetic field such as to orient the first magnetization at about 90° relative to the second magnetization, the first and second magnetizations being oriented symmetrically relative to the direction of the external magnetic field;
wherein the MLU cells are electrically connected in series via a current line.

* * * * *